United States Patent [19]

Agarwal et al.

[11] Patent Number: 5,831,559
[45] Date of Patent: Nov. 3, 1998

[54] ENCODING/DECODING VIDEO SIGNALS USING MULTIPLE RUN-VAL MAPPING TABLES

[75] Inventors: Rohit Agarwal, Beaverton, Oreg.; Joseph N. Romriell, Hyde Park, Utah

[73] Assignee: Intel Corporation, Santa Clara, Calif.

[21] Appl. No.: 671,382

[22] Filed: Jun. 27, 1996

Related U.S. Application Data

[60] Provisional application No. 60/010,518 Jan. 24, 1996.

[51] Int. Cl.⁶ .................................................. H03M 7/00
[52] U.S. Cl. ............................. 341/106; 341/50; 341/59; 341/67
[58] Field of Search ................................. 341/50, 58, 59, 341/67, 106

[56] References Cited

U.S. PATENT DOCUMENTS

| | | | |
|---|---|---|---|
| 4,853,767 | 8/1989 | Sakai et al. | 358/78 |
| 4,953,214 | 8/1990 | Takeguchi et al. | 381/31 |
| 4,982,282 | 1/1991 | Saito et al. | 358/133 |
| 5,253,055 | 10/1993 | Civanlar et al. | 358/133 |
| 5,434,567 | 7/1995 | Mack et al. | 341/50 |
| 5,440,404 | 8/1995 | Okamoto | 358/432 |

*Primary Examiner*—Brian K. Young
*Assistant Examiner*—Jason L. W. Kost
*Attorney, Agent, or Firm*—William H. Murray, Esq.; N. Stephan Kinsella, Esq.

[57] ABSTRACT

Two or more run-val mapping tables are selected to encode different subsets of video signals of a sequence of video signals. Each run-val mapping table is selected to map a particular set of run-val pairs to a corresponding set of run-val codes. Each run-val pair comprises a run and a val, the run corresponding to a length of a run of video signals having value zero and the val corresponding to a video signal having a non-zero value. Each run-val mapping table is used to generate a different part of an encoded bitstream for the sequence of video signals. The encoded bitstream is then decoded using the two or more selected run-val mapping tables. In a preferred embodiment, the selected run-val mapping tables are explicitly identified in the bitstream.

15 Claims, 17 Drawing Sheets

COMBINED HISTOGRAM ENTRIES

| \|VAL\| | | | | | | | | | | | | |
|---|---|---|---|---|---|---|---|---|---|---|---|---|
| 8 | 3 | | | | | | | | | | | |
| 7 | 4 | 3 | 1 | | | | | | | | | |
| 6 | 2 | 6 | 2 | 1 | | | | | | | | |
| 5 | 15 | 9 | 4 | 3 | 1 | | | | | | | |
| 4 | 27 | 15 | 8 | 6 | 4 | 3 | 2 | 2 | 1 | | | |
| 3 | 33 | 25 | 15 | 12 | 9 | 7 | 6 | 5 | 0 | 3 | | |
| 2 | 51 | 32 | 20 | 18 | 16 | 13 | 12 | 10 | 3 | 11 | 8 | |
| 1 | 92 | 50 | 31 | 28 | 25 | 21 | 20 | 18 | 11 | 8 | 5 | 3 |
| | 0 | 1 | 2 | 3 | 4 | 5 | 6 | 7 | 8 | 9 | 10 | 11 |

RUN

FIG. 13

COMBINED HISTOGRAM ENTRIES

| \|VAL\| | 0 | 1 | 2 | 3 | 4 | 5 | 6 | 7 | 8 | 9 | 10 | 11 |
|---|---|---|---|---|---|---|---|---|---|---|---|---|
| 8 | 3 | | | | | | | | | | | |
| 7 | 4 | 3 | 1 | | | | | | | | | |
| 6 | 2 | 6 | 4 | 2 | 1 | | | | | | | |
| 5 | 15 | 9 | 4 | 3 | 1 | 1 | | | | | | |
| 4 | 27 | 15 | 8 | 6 | 4 | 3 | 2 | 1 | | | | |
| 3 | 33 | 25 | 15 | 12 | 9 | 7 | 6 | 5 | 3 | | | |
| 2 | 51 | 32 | 20 | 18 | 16 | 13 | 12 | 10 | 8 | 8 | 5 | 3 |
| 1 | 92 | 50 | 31 | 28 | 25 | 21 | 20 | 18 | 11 | 9 | 10 | 11 |
| | 0 | 1 | 2 | 3 | 4 | 5 | 6 | 7 | 8 | 9 | 10 | 11 |

RUN (Bold values indicate underlined entries in the original figure.)

ENCODING/DECODING VIDEO SIGNALS USING MULTIPLE RUN-VAL MAPPING TABLES

CROSS-REFERENCES TO RELATED APPLICATIONS

This nonprovisional U.S. national application, filed under 35 U.S.C. §111(a), claims, under 35 U.S.C. §119(e)(1), the benefit of the filing date of provisional U.S. national application Ser. No. 60/010,518, filed under 35 U.S.C. §111(b) on Jan. 24, 1996 as attorney docket no. 366431-136P, the teachings of which are incorporated herein by reference. This application is also related to U.S. patent application Ser. No. 08/558,258, filed Nov. 13, 1995 as attorney docket no. 366431-022 ("the '1022 application"). This application also claims, under 35 U.S.C. §120, the benefit of the filing date of U.S. patent application Ser. No. 08/568,247, filed Dec. 6, 1195 as attorney docket no. 366431-096 ("the '1096 application"), the teachings of which are incorporated by reference.

BACKGROUND OF THE INVENTION

1. Field of the Invention

The present invention relates to image processing, and, in particular, to encoding video signals using run-length encoding.

2. Description of the Related Art

Many image compression algorithms are based upon the quantization of block transform coefficients. In such algorithms, an (N×N) block of image signals is transformed by a block transform, such as a slant, Haar, or discrete cosine transform (DCT). The resulting transform coefficients are quantized based typically on the visual importance of the various coefficients in the transformed block. Because of the energy compaction of the block transform followed by the quantization step, many zeros are generally found in the block of quantized transform coefficients. After the quantization of the coefficients, the block is scanned in order to create a sequential array of quantized coefficients.

This sequential array can be further encoded using run-length encoding to represent the quantized coefficients as alternating values corresponding to lengths of runs of quantized coefficients having a value of zero and quantized coefficients having a non-zero value. These alternating values can be represented as run-val pairs, where each run-val pair comprises a run of zeros followed by a non-zero value. The run-val pairs may themselves be further encoded as run-val codes by applying a run-val napping table, where each run-val code in the mapping table corresponding to a different run-val pair. The run-val codes may then be further encoded using variable-length encoding based, for example, on a specified Huffman table.

The present invention is directed to an efficient approach to run-length encoding of image signals using run-val pairs.

Further objects and advantages of this invention will become apparent from the detailed description of a preferred embodiment which follows.

SUMMARY OF THE INVENTION

The present invention comprises a method, an apparatus, and a storage medium encoded with machine-readable computer program code for encoding video signals. According to a preferred embodiment, run-val pairs are generated for a sequence of video signals, wherein each run-val pair comprises a run and a val, the run corresponds to a length of a run of video signals having value zero, and the val corresponds to a video signal having a non-zero value. A first run-val mapping table is selected which maps a first set of run-val pairs to a corresponding first set of run-val codes. A first subset of video signals of the sequence is encoded using the first run-val mapping table to generate a first part of an encoded bitstream. A second run-val mapping table is selected which maps a second set of run-val pairs to a corresponding second set of run-val codes. A second subset of video signals of the sequence is encoded using the second run-val mapping table to generate a second part of the encoded bitstream.

The present invention also comprises a method, an apparatus, and a storage medium encoded with machine-readable computer program code for decoding encoded video signals. According to a preferred embodiment, a bitstream of encoded video signals is received. A first run-val mapping table is selected which maps a first set of run-val codes to a corresponding first set of run-val pairs, wherein each run-val pair comprises a run and a val, the run corresponds to a length of a run of decoded video signals having value zero and the val corresponds to a decoded video signal having a non-zero value. A first subset of encoded video signals of the bitstream is decoded using the first run-val mapping table to generate a first part of a sequence of decoded video signals. A second run-val mapping table is selected which maps a second set of run-val codes to a corresponding second set of run-val pairs. A second subset of encoded video signals of the bitstream is decoded using the second run-val mapping table to generate a second part of the sequence.

BRIEF DESCRIPTION OF THE DRAWINGS

Other objects, features, and advantages of the present invention will become more fully apparent from the following detailed description of the preferred embodiment, the appended claims, and the accompanying drawings in which:

FIG. 12 is a run-|val| table corresponding to the two-dimensional histogram for all of the run-val pairs of a hypothetical training set;

FIG. 13 is a run-|val| table corresponding to the histogram of FIG. 12 with the removal of run-val pairs indicated by crossed-out entries with double underlining;

DESCRIPTION OF THE PREFERRED EMBODIMENT(S)

According to a preferred embodiment of the present invention, a set of predefined run-val mapping tables are generated using an off-line training process. For each set of video signals to be encoded, a run-val mapping table is selected from the set of predefined run-val mapping tables and used to encode the set of signals during on-line processing.

System Hardware Architectures

Figure 1:
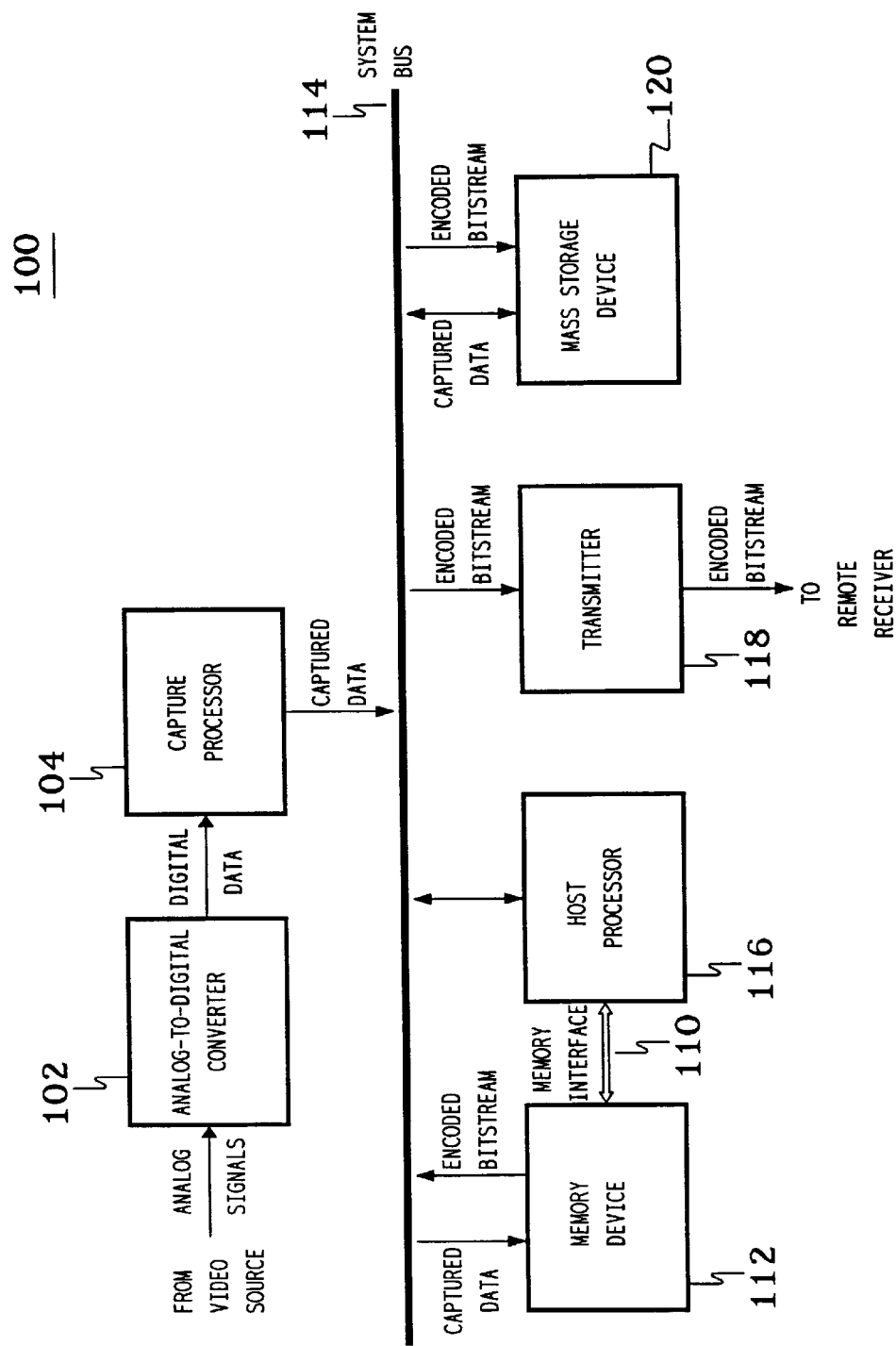
FIG. 1 is a block diagram of a computer system for encoding video signals, according to a preferred embodiment of the present invention.

Referring now to FIG. 1, there is shown a block diagram of computer system 100 for encoding video signals, according to a preferred embodiment of the present invention. Analog-to-digital (A/D) converter 102 of encoding system 100 receives analog video signals from a video source. The video source may be any suitable source of analog video signals such as a video camera or VCR for generating local analog video signals or a video cable or antenna for receiving analog video signals from a remote source. A/D converter 102 separates the analog video signal into constituent components and digitizes the analog components into digital video component data (e.g., in one embodiment, 24-bit RGB component data).

Capture processor 104 captures the digital 3-component video data received from converter 102. Capturing may include one or more of color conversion (e.g., RGB to YUV), scaling, and subsampling. Each captured video frame is represented by a set of three two-dimensional component planes, one for each component of the digital video data. In one embodiment, capture processor 104 captures video data in a YUV9 (i.e., YUV 4:1:0) format, in which every (4×4) block of pixels of the Y-component plane corresponds to a single pixel in the U-component plane and a single pixel in the V-component plane. Capture processor 104 selectively stores the captured data to memory device 112 and/or mass storage device 120 via system bus 114. Those skilled in the art will understand that, for real-time encoding, the captured data are preferably stored to memory device 112, while for non-real-time encoding, the captured data are preferably stored to mass storage device 120. For non-real-time encoding, the captured data will subsequently be retrieved from mass storage device 120 and stored in memory device 112 for encode processing by host processor 116.

During encoding, host processor 116 reads the captured bitmaps from memory device 112 via high-speed memory interface 110 and generates an encoded video bitstream that represents the captured video data. Depending upon the particular encoding scheme implemented, host processor 116 applies a sequence of compression steps to reduce the amount of data used to represent the information in the video images. The resulting encoded video bitstream is then stored to memory device 112 via memory interface 110. 1Host processor 116 may copy the encoded video bitstream to mass storage device 120 for future playback and/or transmit the encoded video bitstream to transmitter 118 for real-time transmission to a remote receiver (not shown in FIG. 1).

Figure 2:
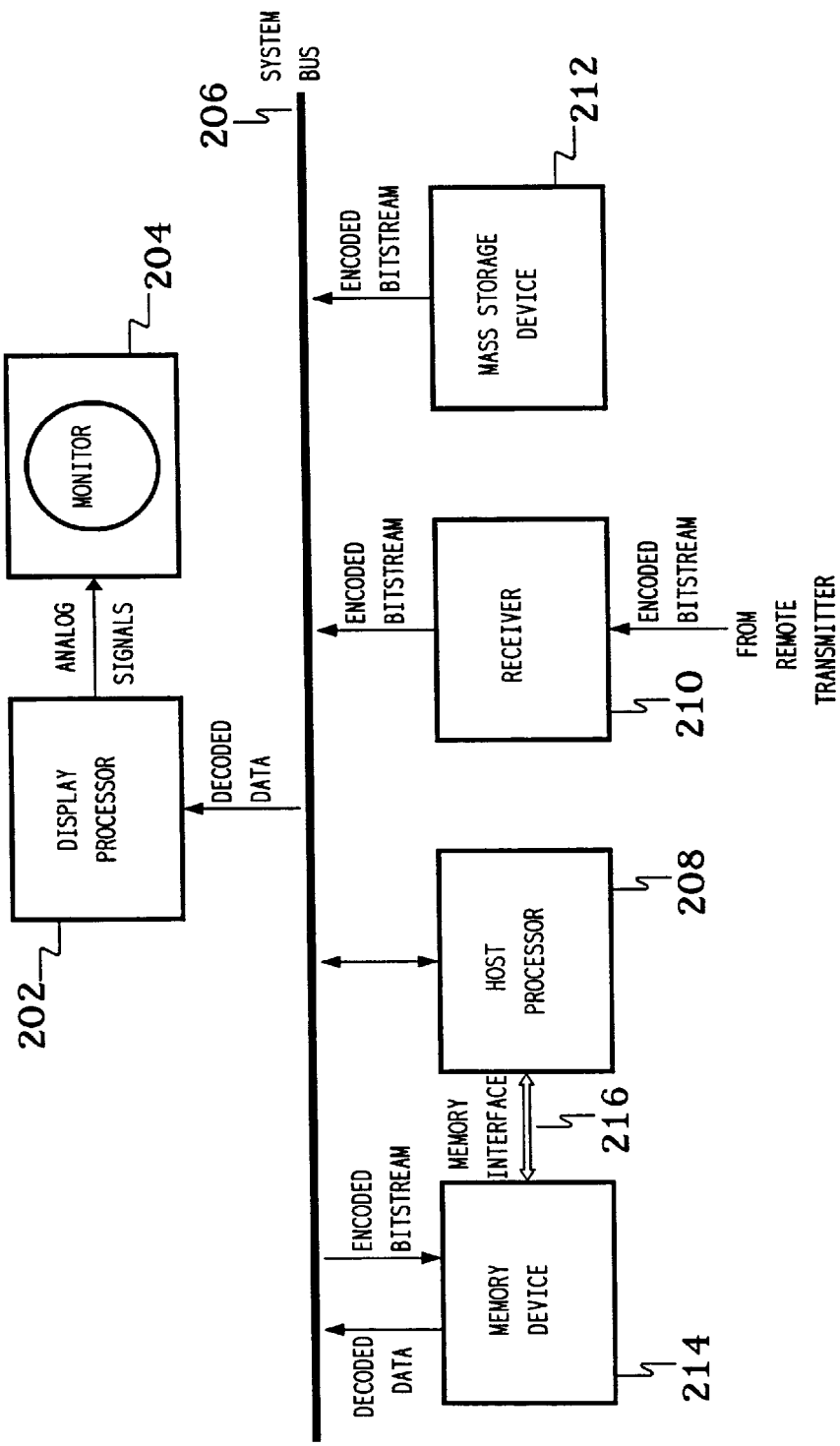
FIG. 2 is a block diagram of a computer system for decoding the video signals encoded by the computer system of FIG. 1, according to a preferred embodiment of the present invention.

Referring now to FIG. 2, there is shown a block diagram of computer system 200 for decoding the encoded video bitstream generated by encoding system 100 of FIG. 1, according to a preferred embodiment of the present invention. The encoded video bitstream is either read from mass storage device 212 of decoding system 200 or received by receiver 210 from a remote transmitter, such as transmitter 118 of FIG. 1. The encoded video bitstream is stored to memory device 214 via system bus 206.

Host processor 208 accesses the encoded video bitstream stored in memory device 214 via high-speed memory interface 216 and decodes the encoded video bitstream for display. Decoding the encoded video bitstream involves undoing the compression processing implemented by encoding system 100 of FIG. 1. Host processor 208 stores the resulting decoded video data to memory device 214 via memory interface 216 from where the decoded video data are transmitted to display processor 202 via system bus 206. Alternatively, host processor 208 transmits the decoded video data directly to display processor 202 via system bus 206. Display processor 202 processes the decoded video data for display on monitor 204. The processing of display processor 202 includes digital-to-analog conversion of the decoded video data. After being decoded by host processor 208 but before being D/A converted by display processor 202, the decoded video data may be upsampled (e.g., from YUV9 to YUV24), scaled, and/or color converted (e.g., from YUV24 to RGB24). Depending upon the particular embodiment, each of these processing steps may be implemented by either host processor 208 or display processor 202.

Referring again to FIG. 1, encoding system 100 is preferably a microprocessor-based personal computer (PC) system with a special purpose video-processing plug-in board. In particular, A/D converter 102 may be any suitable means for decoding and digitizing analog video signals. Capture processor 104 may be any suitable processor for capturing digital video component data as subsampled frames. In a preferred embodiment, A/D converter 102 and capture processor 104 are contained in a single plug-in board capable of being added to a microprocessor-based PC system.

Host processor 116 may be any suitable means for controlling the operations of the special-purpose video processing board and for performing video encoding. Host processor 116 is preferably a general-purpose microprocessor manufactured by Intel Corporation, such as an i486™, Pentium®, or Pentium® Pro processor. System bus 114 may be any suitable digital signal transfer device and is preferably a peripheral component interconnect (PCI) bus. Memory device 112 may be any suitable computer memory device and is preferably one or more dynamic random access memory (DRAM) devices. High-speed memory interface 110 may be any suitable means for interfacing between memory device 112 and host processor 116. Mass storage device 120 may be any suitable means for storing digital data and is preferably a computer hard drive. Transmitter 118 may be any suitable means for transmitting digital data to a remote receiver. Those skilled in the art will understand that the encoded video bitstream may be transmitted using any suitable means of transmission such as telephone line, RF antenna, local area network, or wide area network.

Referring again to FIG. 2, decoding system 200 is preferably a microprocessor-based PC system similar to the basic PC system of encoding system 100. In particular, host processor 208 may be any suitable means for decoding an encoded video bitstream and is preferably a general purpose microprocessor manufactured by Intel Corporation, such as an i486™, Pentium®, or Pentium® Pro processor. System bus 206 may be any suitable digital data transfer device and is preferably a PCI bus. Mass storage device 212 may be any suitable means for storing digital data and is preferably a CD-ROM device or a hard drive. Receiver 210 may be any suitable means for receiving the digital data transmitted by transmitter 118 of encoding system 100. Display processor 202 and monitor 204 may be any suitable devices for processing and displaying video images (including the conversion of digital video data to analog video signals) and are preferably parts of a board and an Ray system having a PCI 24-bit graphics board and an RGB monitor.

In a preferred embodiment, encoding system 100 of FIG. 1 and decoding system 200 of FIG. 2 are two distinct computer systems. In an alternative preferred embodiment of the present invention, a single computer system comprising all of the different components of systems 100 and 200 may be used to encode and decode video images. Those skilled in the art will understand that such a combined system may be used to display decoded video images in real-time to monitor the capture and encoding of video stream.

In alternative embodiments of present invention, the video encode processing of an encoding system and/or the video decode processing of a decoding system may be assisted by a pixel processor or other suitable component(s) to off-load processing from the host processor by performing computationally intensive operations.

Encode Processing

Figure 3:
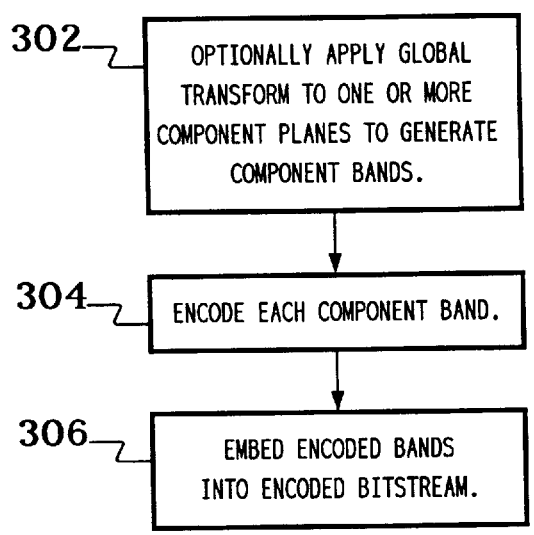
FIG. 3 is a process flow diagram of the compression processing implemented by the host processor of the encoding system of FIG. 1 for each frame of a video stream.

Referring now to FIG. 3, there is shown a process flow diagram of the compression processing implemented by host processor 116 of encoding system 100 of FIG. 1 for each frame of a video stream, according to a preferred embodiment of the present invention.

Figure 4:
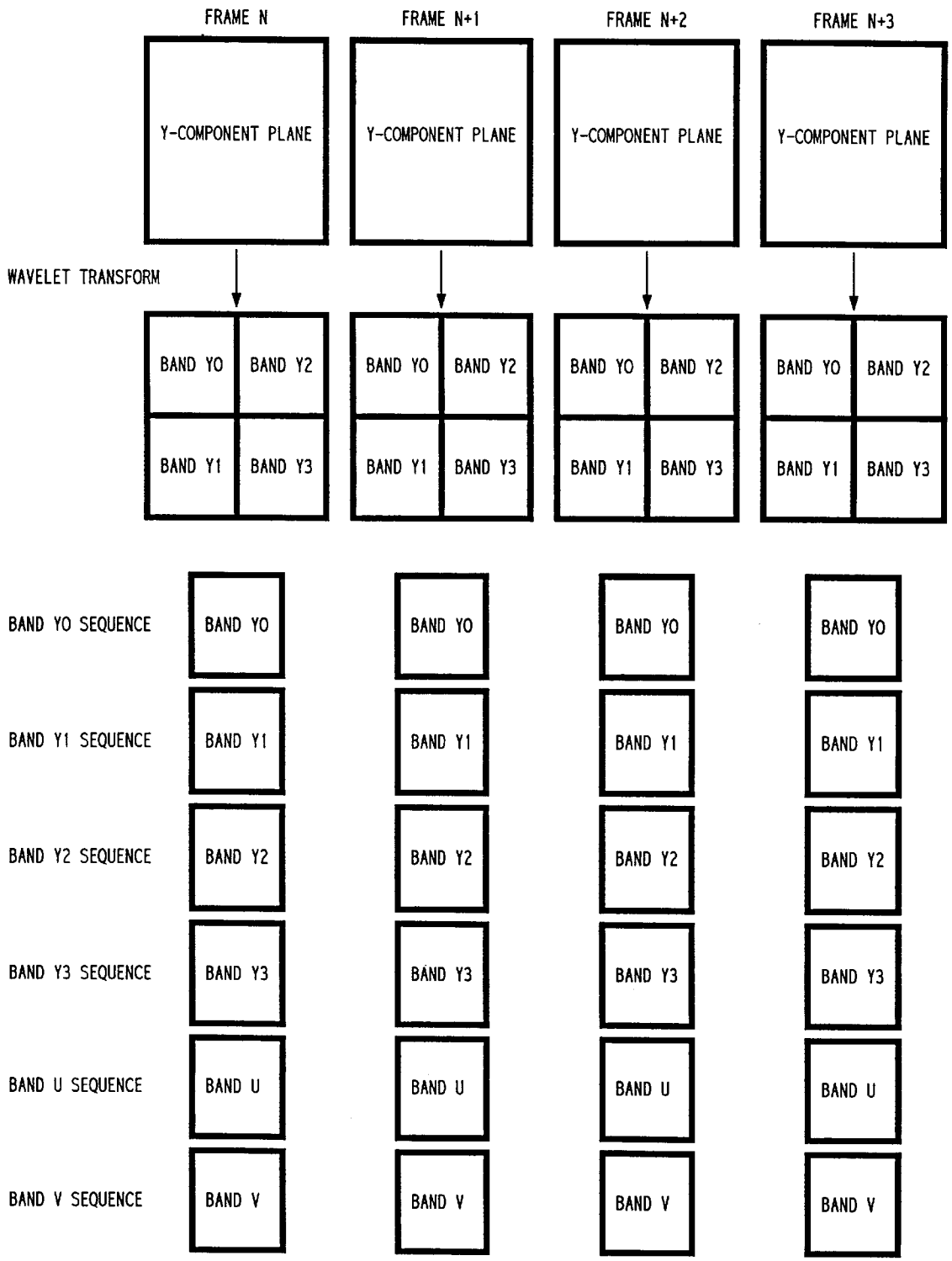
FIG. 4 shows a graphical representation of the six band sequences for the compression processing of FIG. 3.

Compression processing for each frame begins by optionally applying a global transform to one or more of the component planes to decompose the component planes into a plurality of bands (step 302). For example, a forward wavelet transform may be applied to the Y-component plane to globally decompose (i.e., transform) the Y-data into four separate bands of data, thereby producing a total of six bands of data for each frame: four Y-component bands, one U-component band, and one V-component band. FIG. 4 shows a graphical representation of the six band sequences. A preferred forward wavelet transform is described in further detail in the '1022 application in the section entitled "Wavelet Transform."

For purposes of this specification, the four Y-component bands are designated Band Y0, Band Y1 Band Y2, and Band Y3. The subsampled U-component plane (which is not wavelet transformed) is designated Band U, and the subsampled V-component plane (which is also not wavelet transformed) is designated Band V.

Encode processing is then applied to each of the bands of the current frame (step 304 of FIG. 3), where each band is part of a distinct band sequence (e.g., see FIG. 4). The encoded bands are then embedded into the compressed video bitstream to complete the compression processing for the current frame (step 306). Steps 302–306 of FIG. 3 are repeated for each frame of the video stream.

Figure 5:
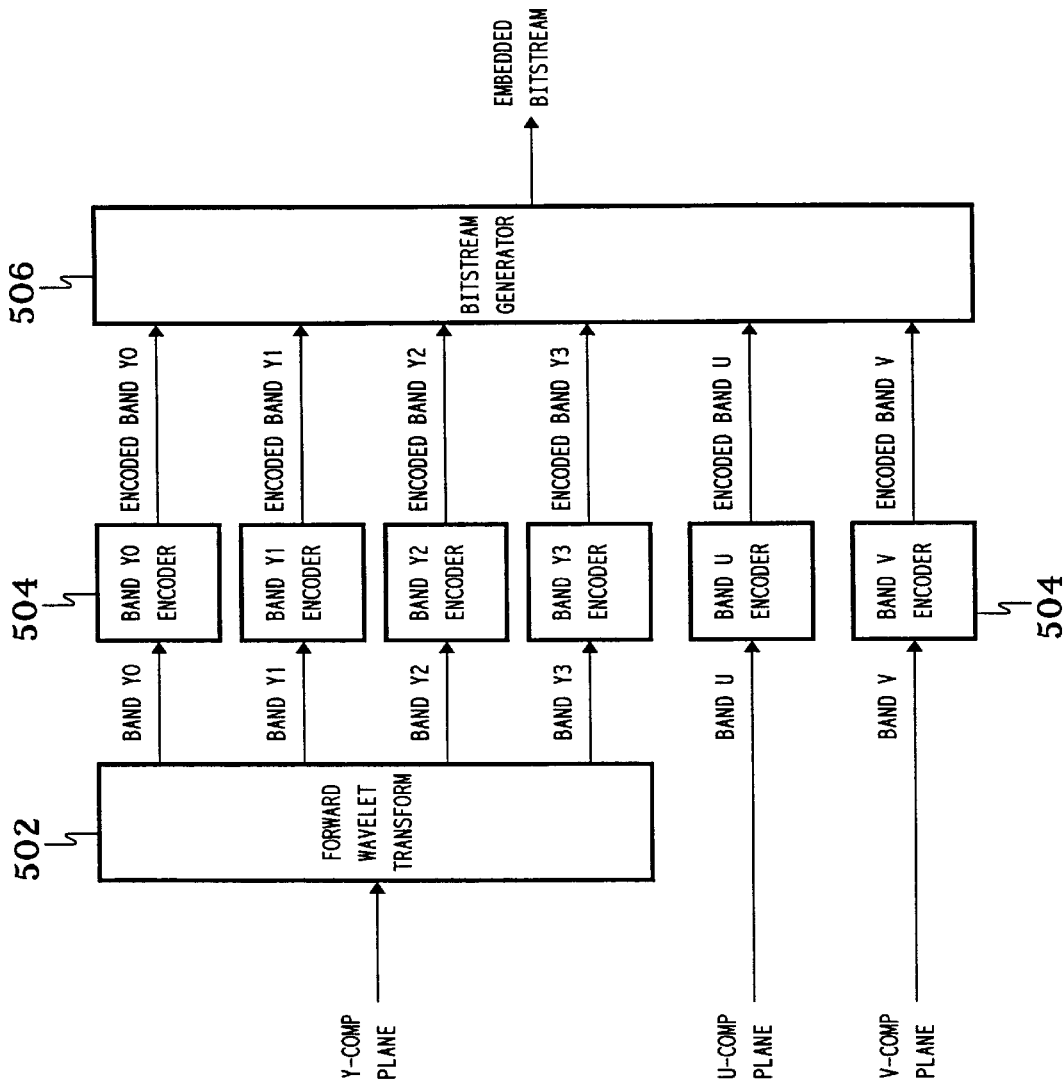
FIG. 5 is a block diagram of a frame encoder that implements the compression processing of FIG. 3.

Referring now to FIG. 5, there is shown a block diagram of frame encoder 500 which implements the compression processing of FIG. 3, when the forward wavelet transform is applied to only the Y-component plane. Transform 502 applies a forward wavelet transform to the Y-component plane of each frame to generate Bands Y0–Y3 (step 302 of FIG. 3). Band encoders 504 encode the six bands of data (step 304 of FIG. 3) and bitstream generator 506 embeds the resulting encoded bands into the encoded video bitstream (step 306 of FIG. 3). In a preferred embodiment, there is a single band encoder 504 that sequentially encodes the different bands.

Figure 6:
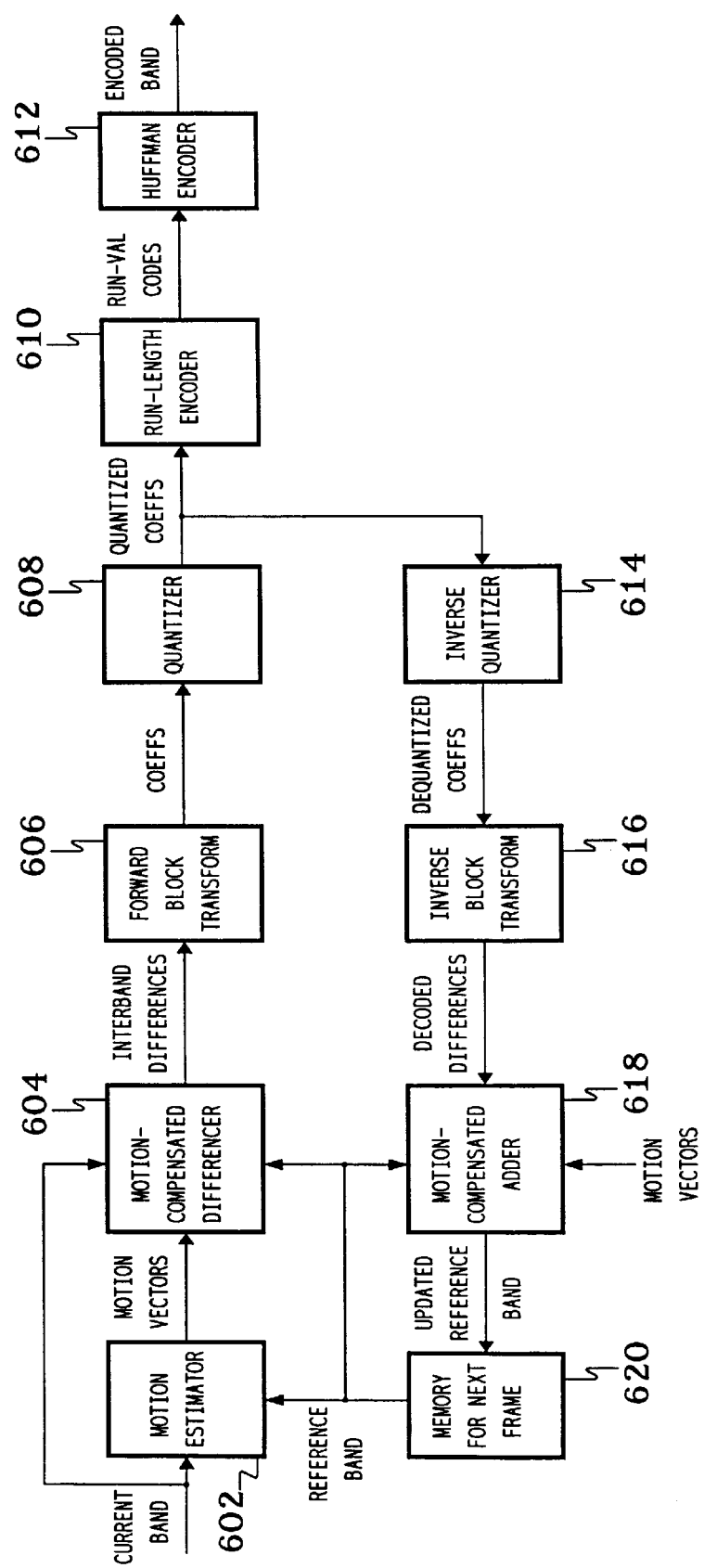
FIG. 6 is a block diagram of each band encoder of FIG. 5 when the coder applies inter-frame encoding to a component band.

Referring now to FIG. 6, there is shown a block diagram of each band encoder 504 of FIG. 5 when band encoder 504 applies inter-frame encoding to a component band, according to a preferred embodiment of the present invention. The inter-frame encoding may be either uni-directional or bi-directional interframe encoding. Band encoder 504 is also capable of applying intra-frame encoding, in which case, the motion estimation of 602, motion-compensated differencing of 604, and the motion-compensated addition of 618 are not performed.

For inter-frame encoding, motion estimator 602 of FIG. 6 performs motion estimation on macroblocks of the current band relative to a reference band to generate a set of motion vectors for the current band. The processing of motion estimator 602 is described in further detail in the '1022 application in the section entitled "Motion Estimation."

Motion-compensated differencer 604 applies the appropriate motion vectors to the reference band to generate a motion-compensated reference band. Differencer 604 also generates interband differences for the current band using the motion-compensated reference band and the current band.

A forward block transform 606 is applied to each block to generate coefficients for the current band. In a preferred embodiment, transform 606 may selectively apply any of the following transforms: a DCT transform, a slant transform, a Haar transform, or a "Slaar" transform which is a hybrid of a slant transform and a Haar transform. The selected transform may be either a one-dimensional or two-dimensional transform, and may differ from band to band. In addition, transform 606 may be disabled for any band, so that the block signals are not transformed before quantization. The processing of forward block transform 606 is described in further detail in the '1022 application in the sections entitled "Block Transform" and "Decode Rate Control." For intra-frame encoding, the forward block transform 606 is applied directly to the block of band signals, rather than to inter-frame difference signals.

Quanitizer 608 quantizes the coefficients to generate quantized coefficients for the current band. Quantizer 608 applies uniform scalar quantization, wherein each coefficient is divided by a specified integer scale factor. The processing of quantizer 608 is described in further detail in the '1022 application in the section entitled "Adaptive Quantization."

Run-length encoder 610 transforms the quantized coefficients into run-length encoded (RLE) data. In a preferred embodiment, run-length encoder 610 applies adaptive run-length encoding to generate a sequence of run-val pairs for each block of quantized coefficients, where each run-val pair is a value corresponding to the length of a run of zero coefficients (i.e., coefficients that are quantized to zero) followed by a non-zero quantized coefficient. In a preferred embodiment, run-length encoder 610 follows an adaptively-generated scan pattern that tends to provide a long run of zero coefficients for the last run of the block. The adaptive run-length encoding of run-length encoder 610 is described in further detail in the '1022 application in the section entitled "Adaptive Run-Length Encoding."

Run-length encoder 610 also applies a run-val mapping table to map the run-val pairs to a sequence of run-val codes. This transformation of run-val pairs to run-val codes is described in further detail later in this specification in the section entitled "Run-Val Mapping Tables."

Huffman encoder 612 applies Huffman-type entropy (a.k.a. statistical or variable-length) coding to the run-val codes to generate the encoded data for the current band. The processing of Huffman encoder 612 is described in further detail in the '1096 application in the section entitled "Huffman Encoding."

As shown in FIG. 6, band encoder 504 also decodes the encoded band data to update the reference band used in encoding the corresponding band of another video frame. Since the run-length and Huffman encoding of 610 and 612 are lossless encoding steps, the decode loop of band encoder 504 preferably begins decode processing with inverse quantizer 614, which dequantizes the quantized coefficients to generate dequantized coefficients for the current band.

Inverse block transform 616 applies the inverse of forward block transform 606 to the dequantized coefficients to generate decoded differences for the current band. Motion-compensated adder 618 applies the motion vectors generated by motion estimator 602 to the current reference band to generate motion-compensated reference band data. Adder 618 also performs interband addition using the motion-compensated reference band data and the decoded differences to generate an updated reference band. The updated reference band is stored in memory 620 for use in generating the reference band for encoding the corresponding band of another video frame.

Those skilled in the art will understand that, when decoding the quantized coefficients for intra-frame encoded blocks, the outputs of inverse block transform 616 are the decoded pixels for the updated reference band and motion-compensated adder 618 is disabled.

Decode Processing

Figure 7:
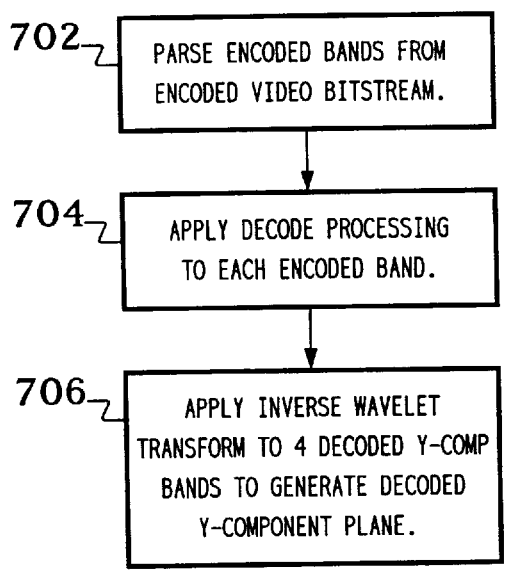
FIG. 7 is a process flow diagram of the decompression processing implemented by the host processor of the decoding system of FIG. 2 for each encoded frame of the encoded video bitstream.

Referring now to FIG. 7, there is shown a process flow diagram of the decompression processing implemented by host processor 208 of decode system 200 of FIG. 2 for each encoded frame of the encoded video bitstream, according to a preferred embodiment of the present invention. Host processor 208 parses the encoded bands from the encoded video bitstream (step 702 of FIG. 7) and applies decode processing to each of the encoded bands (step 704). In the case where the Y-component plane was decomposed into four bands during encoding, an inverse transform is applied to the four decoded Y-component bands to generate the decoded Y-component plane (step 706). The decoded Y-component plane data are then processed with the decoded U- and V-component plane data to generate a decoded video image for display. A preferred inverse transform is described in further detail in the '1022 application in the section entitled "Wavelet Transform."

Figure 8:
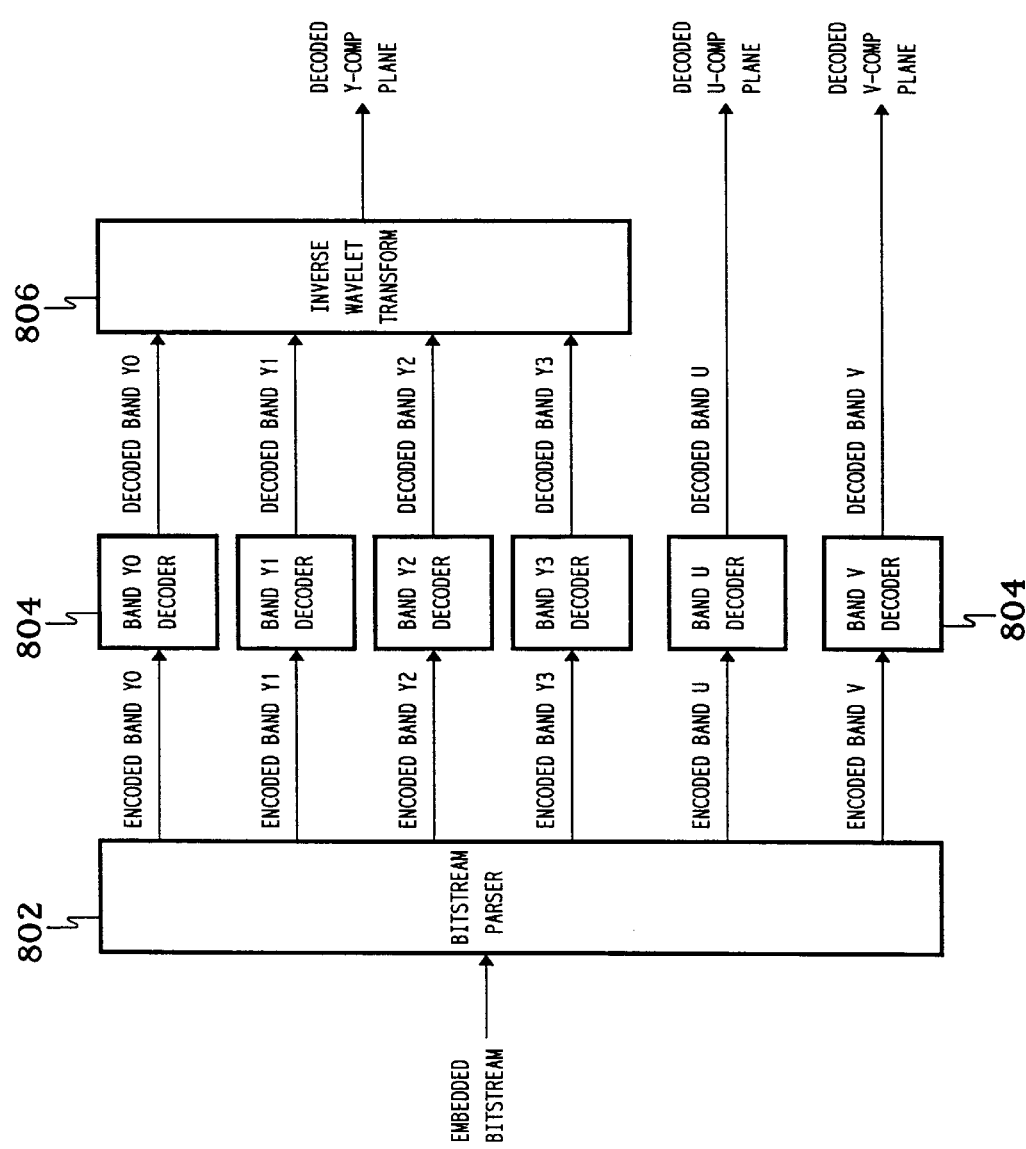
FIG. 8 is a block diagram of a frame decoder that implements the decompression processing of FIG. 7.

Referring now to FIG. 8, there is shown a block diagram of frame decoder 800 which implements the decompression processing of FIG. 7. Bitstream parser 802 parses the embedded bitstream into the encoded band sequences (step 702 of FIG. 7). Band decoders 804 decode the bands of encoded data for each frame (step 704 of FIG. 7) and inverse wavelet transform 806 applies an inverse wavelet transform to the decoded Y-component bands to generate the decoded Y-component plane (step 706 of FIG. 7). In a preferred embodiment, there is a single band decoder 804 that sequentially decodes the different encoded bands.

Figure 9:
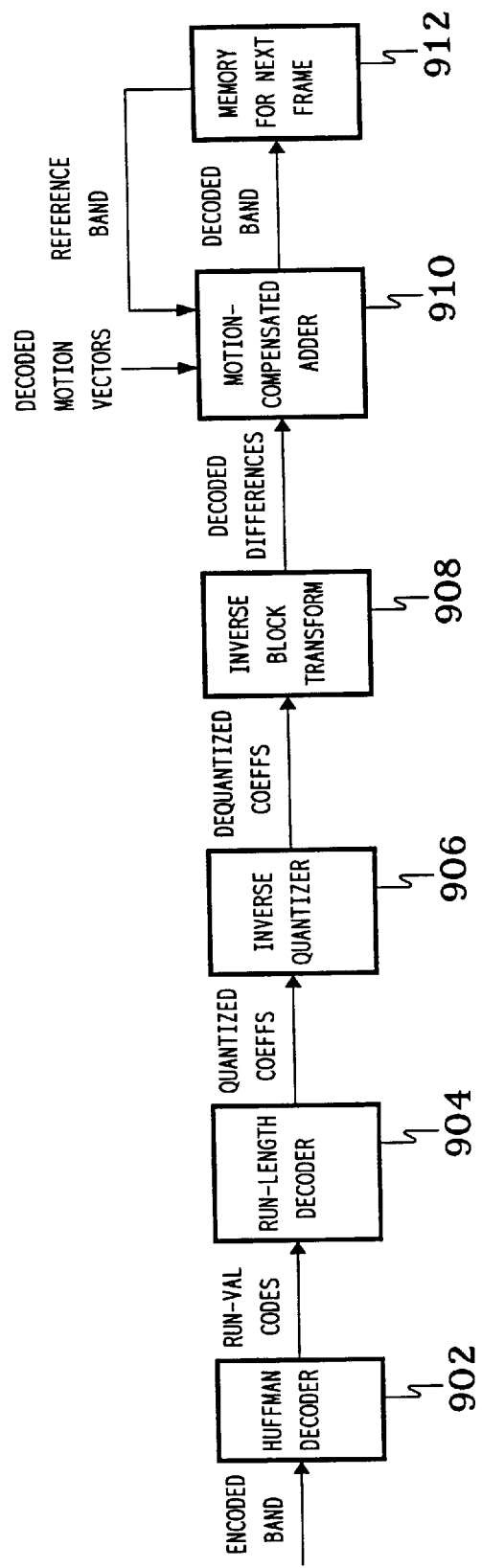
FIG. 9 is a block diagram of each band decoder of FIG. 8 when decoding an inter-frame encoded band of the encoded video bitstream.

Referring now to FIG. 9, there is shown a block diagram of each band decoder 804 of FIG. 8 when decoding an inter-frame encoded band of the encoded video bitstream, according to one embodiment of the present invention. Band decoder 804 of FIG. 9 reverses the encode processing of band encoder 504 of FIG. 6.

In particular, Huffman decoder 902 of FIG. 9 applies statistical decoding to the encoded data for the current band to reconstruct the run-val codes. The processing of Huffman decoder 902 is described in further detail in the '1022 application in the section entitled "Statistical Decoding."

Run-length decoder 904 transforms the run-length codes into quantized coefficients. Inverse quantizer 906 dequantizes the quantized coefficients to generate dequantized coefficients. Inverse block transform 908 applies the inverse of forward block transform 606 of FIG. 6 to the dequantized coefficients to generate decoded differences.

Motion-compensated adder 910 applies decoded motion vectors to the reference band to generate motion-compensated reference band data, and performs inter-frame addition using the motion-compensated reference band data and the decoded differences to generate the decoded data for the current band. The decoded band is then stored in memory 912 for use as a reference band for decoding the corresponding band of another video frame. If the decoded band corresponds to a Y-component band, the decoded band data are also used to reconstruct the decoded Y-component plane (step 706 of FIG. 7). Otherwise, the decoded band is either the decoded U- or V-component plane. In any case, the decoded band is used to generate the decoded image for display.

The decoding for intra-frame encoded blocks is equivalent to the decoding for inter-frame encoded blocks shown in FIG. 9, except that the motion-compensated addition of 910 is not performed. In that case, the outputs of inverse block transform 908 are the decoded pixels for the updated reference band.

Run-Val Mapping Tables

As described earlier in this specification in connection with FIG. 6, run-length encoder 610 scans the quantized coefficients for each block to generate a sequence of run-val pairs. Run-length encoder 610 also applies a run-val mapping table to the run-val pairs to generate a sequence of run-val codes for each block. According to a preferred embodiment of the present invention, the mapping of run-val pairs to run-val codes comprises two phases: (1) an off-line training phase and (2) an on-line encoding phase. During the off-line training phase, a set of run-val mapping tables is generated based on a set of training video sequences. These predefined run-val mapping tables are then programmed into both the encoder and the decoder. During the on-line encoding phase, the encoder decides which of the predefined run-val mapping tables to select to encode each different set of video signals to be compressed for transmission and/or storage. The run-val mapping table selection is explicitly encoded into the generated compressed bitstream in order to notify the decoder which table to use to decode the run-val codes in the bitstream. These off-line training and on-line encoding phases are described in the next three sections of this specification.

Generation of Run-Val Mapping Tables

Figure 10:
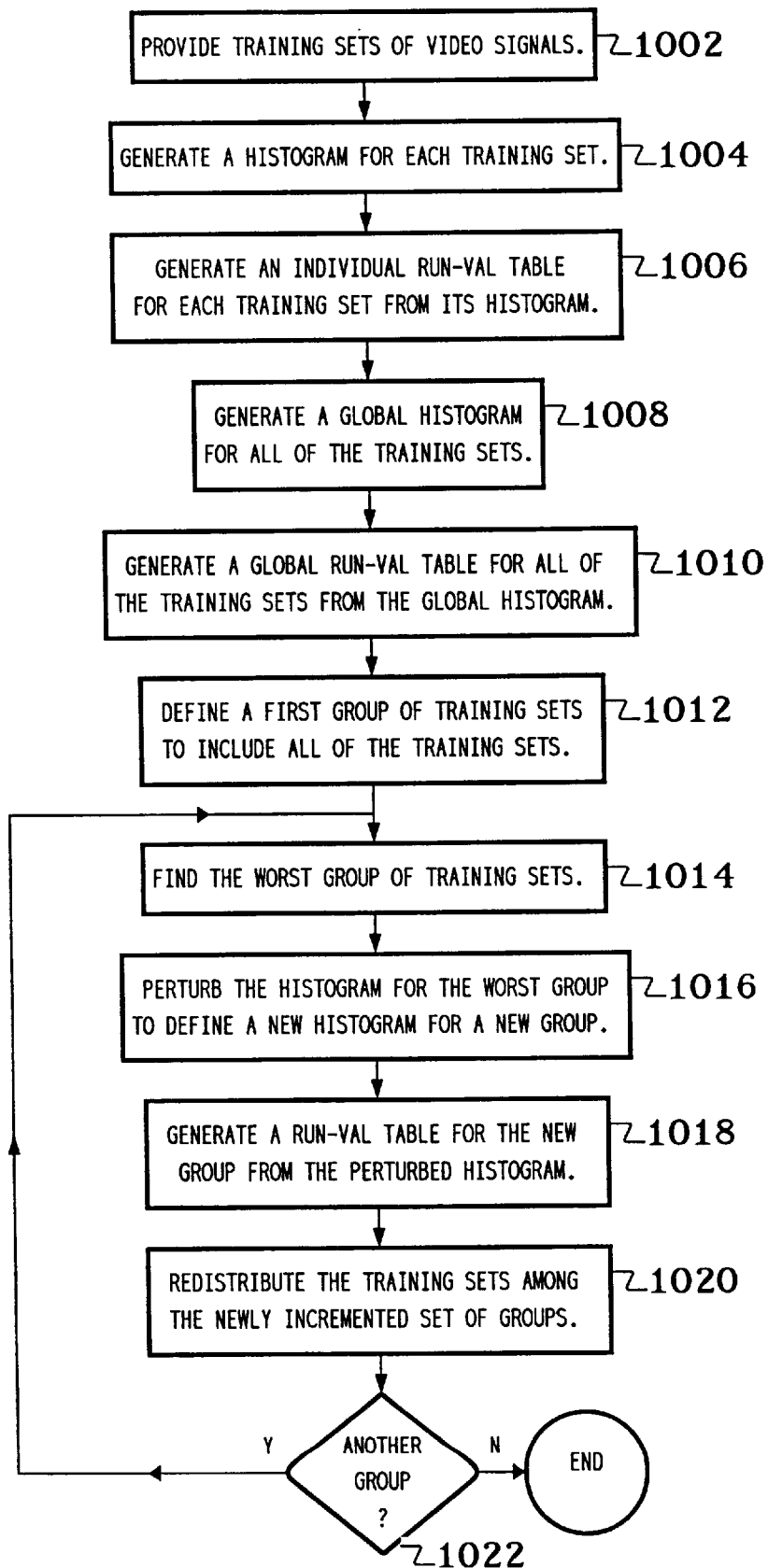
FIG. 10 is a flow diagram of the training processing implemented off line to generate a set of run-val mapping tables to be used for subsequent on-line encoding of video sequences, according to a preferred embodiment of the present invention.

Referring now to FIG. 10, there is shown a flow diagram of the off-line training processing that generates a set of run-val mapping tables to be used for subsequent on-line encoding of video sequences, according to a preferred embodiment of the present invention. Training is based on sets of video signals that are preferably selected to be representative of the types of video sequences to be encoded during on-line processing (step 1002 of FIG. 10). A two-dimensional histogram is generated for each training set (step 1004) and a run-val mapping table is generated for each histogram (step 1006). Each training set preferably corresponds to a band of a video frame, although other groupings of video signals (larger or smaller) may alternatively be used. The generation of a run-val mapping table from a training set is described in further detail later in this specification in the section entitled "Generating Each Run-Val Mapping Table."

A two-dimensional global histogram is also generated for all of the training sets (step 1008) and a corresponding global run-val mapping table is generated from that global histogram (step 1010). Those skilled in the art will understand that the global histogram may be generated as the sum of the histograms for the individual training sets. The global run-val mapping table is then generated from the global histogram the same way that individual run-val mapping tables are generated as described later in this specification in the section entitled "Generating Each Run-Val Mapping Table."

Under a preferred embodiment of the present invention, the process of generating a specified number (N) of run-val mapping tables that optimally encode the training sets is an iterative process that begins by treating all of the training sets as if they were members of a single group of training sets to be encoded by a single run-val mapping table. With each iteration, a new group is created and the training sets are redistributed among the newly incremented number of groups. The iteration is repeated until N groups of training sets are generated. At that time, N run-vat mapping tables will have been generated, one for each group of training sets.

In particular, the initial single group of training sets is defined to include all of the training sets (step 1012). The worst group of training sets is then identified (step 1014). In general, the worst group is defined to be the group of training sets that is most inefficiently encoded using a single run-val mapping table, where that single run-val mapping table is generated from the composite histogram for that group of training sets. The composite histogram may be generated as the sum of the histograms for each of the training sets in the group. A preferred measure M of the efficiency with which a particular group of T training sets is encoded using a single run-val mapping table is given as follows:

$$M = B\left(\sum_{i}^{T} h_i\right) - \sum_{i}^{T} [B(h_i)] \quad (1)$$

where $h_i$ is the histogram for the ith training set, the sum of the $h_i$ is the composite histogram for the group of T training sets, and B is a function that returns the number of bits required to encode the one or more training sets corresponding to the histogram operand using the run-val mapping table generated from that histogram. Thus, the measure M is the difference in number of bits between encoding the particular group of training sets using a single run-val mapping table versus encoding each of the training sets using the individual run-val mapping table generated for each training set.

In general, the function B generates the number of bits required to encode a given training set using a specified run-val mapping table. One way to generate that number of bits is actually to encode the video signals of the training set using the run-val mapping table and count of the number of bits in the bitstream.

In an alternative embodiment of the present invention, the number of bits to encode is generated without performing the actual encoding. The histogram for a given training set defines how many times each run-val pair appears in the set. The run-val mapping table for the given training set defines the run-val codes used to represent the run-val pairs for that set. A selected Huffman table will then define the number of bits required to encode each of the run-val codes. Thus, the number of bits required to encode a given training set using a given run-val mapping table is the sum of the products of the frequency of each run-val pair (derived from the histogram) times the length of the variable-length (VL) code associated with that run-val pair (derived from the run-vat mapping table and the selected Huffman table). As such, the function B may be defined as follows:

$$B = \Sigma f_j l_j \quad (2)$$

wherein $f_j$ is the frequency of run-val pair j and $l_j$ is the length in bits for the VL code associated with run-val pair j.

If the measure M for a first group of training sets is less than the measure M for a second group of training sets, then the first group can be more efficiently encoded using its group run-val mapping table than can be the second group using its group run-val mapping table. In that case, the second group is said to constitute a worse grouping of training sets than the first group. During the first iterative pass of FIG. 10, where there is only one group (containing all of the training sets), that one group is defined to be the worst group in step 1014.

After identifying the worst group of the current number of groups in step 1014, the histogram for the worst group is perturbed to generate and define a new histogram for a newly created group of training sets (step 1016). In one possible embodiment, the perturbation to the selected histogram is a random perturbation. In an alternative embodiment, where the general shape of the ideal statistical distribution for the training sets is known, the perturbation may be perturbed in a predefined manner. For example, the general shape for the ideal statistical pattern for run-val pairs of quantized transform coefficients may be a two-dimensional Laplacian distribution with the greatest probability at the origin and decreasing probability with increasing distance from the origin. In that case, the selected histogram is preferably perturbed towards that ideal shape.

The selected histogram may be perturbed in the following manner. Find the mean frequency of the histogram. For each value represented in the histogram, if the frequency of that value is less than the mean frequency, then increase the frequency by a fixed percentage (e.g., 10%). If the frequency of the value is greater than the mean frequency, then decrease the frequency by the same fixed percentage. If the frequency of the value is equal to the mean frequency, then leave the frequency unchanged. Those skilled in the art will understand that the perturbed histogram will represent a more uniform distribution than the original histogram.

The run-val mapping table corresponding to the perturbed histogram is then generated for the new group (step 1018), while retaining the run-val mapping tables for the unperturbed histograms of the old groups. The training sets are then redistributed among the newly incremented number of groups (step 1020). The processing for the redistribution of training sets of step 1020 is described in further detail with regard to FIG. 11. If the number of groups has reached the specified number N of desired groups (step 1022), then the generation of the N run-val mapping tables is complete. Otherwise, processing returns to repeat steps 1014–1020 to add another group.

In an alternative embodiment, rather than perturbing the histogram to result in a different run-val mapping table, the run-val mapping table is directly perturbed to achieve substantially the same result.

Figure 11:
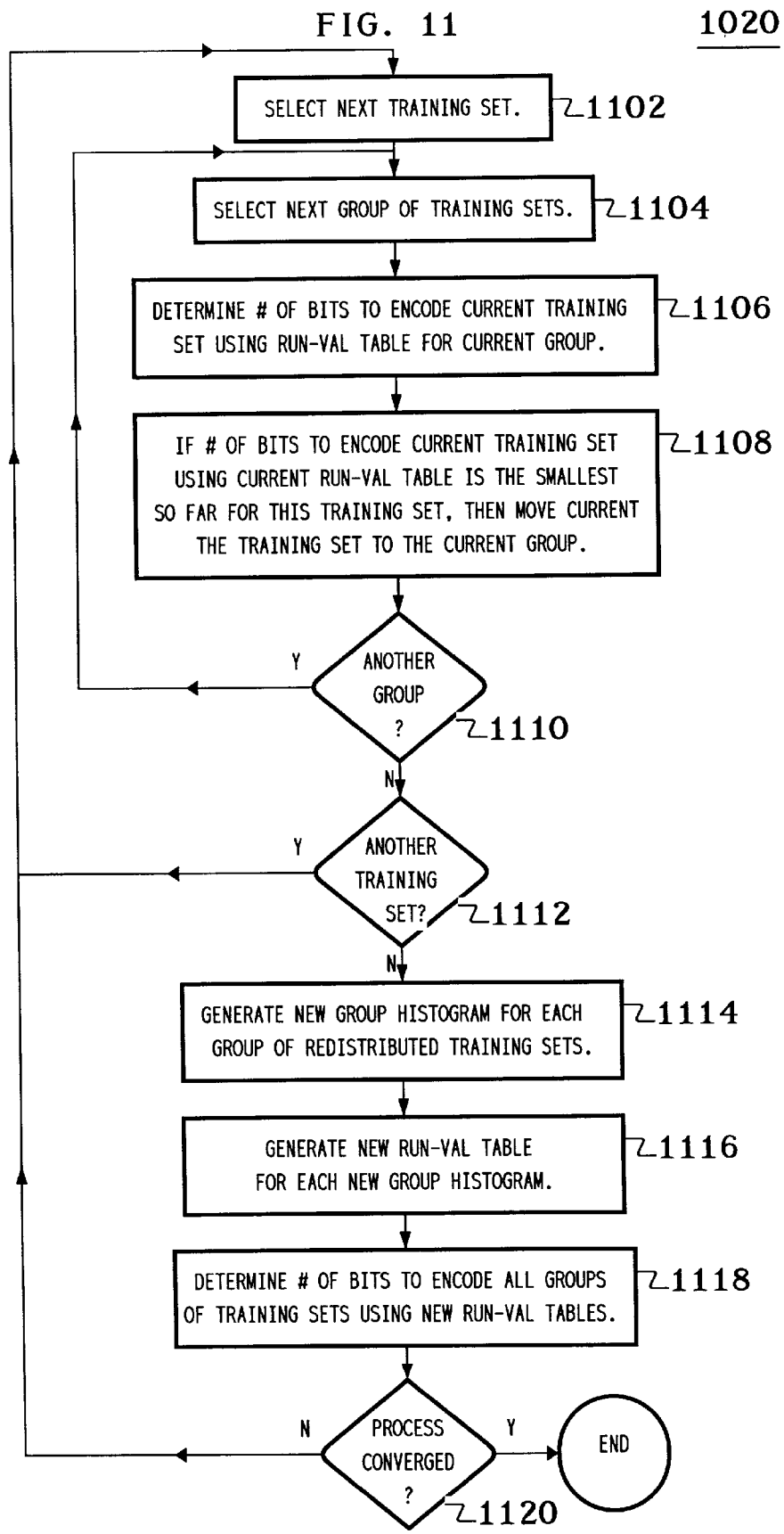
FIG. 11 is a flow diagram of the processing of FIG. 10 performed to redistribute the training sets among the newly incremented set of groups.

Referring now to FIG. 11, there is shown a flow diagram of the processing performed to redistribute the training sets among the newly incremented number of groups (step 1020 of FIG. 10), according to a preferred embodiment of the present invention. The training sets are redistributed among the groups by determining how many bits it takes to encode each training set using the run-val mapping table associated with each group and moving the training set to the group that does the best job (i.e., the fewest bits). Since the run-val mapping table for a given group is generated from the histograms for the training sets in that group, redistributing the training sets among the various groups will affect the run-val mapping tables for those groups. The preferred redistribution process takes this into account by (1) redistributing the training sets and (2) updating the run-val mapping tables, and repeating steps (1) and (2) until no training sets change groups. At that point, the number of bits to encode will not change from the previous iteration loop and the redistribution processing is terminated.

In particular, the next training set is selected (step 1102 of FIG. 11) and the next group of training sets is selected (step 1104). It is then determined how many bits B are required to encode the current training set using the run-val mapping table corresponding to the current group as shown in Equation (2) (step 1106). If the number of bits used to encode the current training set using the current run-val mapping table is the smallest so far for this training set, then move the current training set to the current group (step 1108). If there is another group to compare to for the current training set (step 1110), then return to step 1104. Otherwise, the current training set has been compared to all of the existing groups and processing continues to step 1112. If there is another training set to test (step 1112), then return to step 1102. Otherwise, all of the training sets have been tested and processing continues to step 1114.

Processing reaches step 1114 after all of the training sets have been tested using the run-val mapping tables for all of the groups. Since one or more training sets may have been moved from one group to another, the group histogram for each group of redistributed training sets is regenerated (step 1114) and the run-val mapping table for each new group histogram is regenerated to reflect the updated composition of those groups (step 1116). Using Equation (2), it is then determined how many bits are required to encode all of the training sets using the corresponding group run-val mapping tables (step 1118). If the total number of bits has not decreased as compared to the previous pass through the iteration loop, then the process is said to have converged and the redistribution process is complete. Otherwise, if the process has not converged (step 1120), then processing returns to step 1102 to repeat the iteration loop using the updated run-val mapping tables.

The generation of run-val mapping tables using a preferred embodiment of the present invention has advantages over other conventional methods. In general, the run-val mapping tables generated under the present invention may do a better job encoding video signals than those tables generated under other methods. One reason for this is that statistical redundancies between the histograms used to generate the tables are exploited. In general, there are no arbitrary constraints (e.g., quantization level) on how histograms should be grouped. The present invention provides a compact run-val mapping table set (i.e., fewer tables provide similar performance). The closer the training sets represent the signals to be encoded during on-line processing, the better will the generated run-val mapping tables encode those signals.

As described above, in a preferred embodiment, the efficiency with which a run-val mapping table encodes a group of training sets is characterized by the measure of Equation (1). Those skilled in the art will understand that other measures of efficiency may alternatively be used. For example, the efficiency could be characterized in terms of the entropies of the different groups of training sets. In this case, it is not necessary to generate a separate run-val mapping table for each individual training set.

Alternatively, the number of escapes can be used instead of the number of bits as the criterion for generating run-val mapping tables in Equation (1). The two-dimensional histogram for a given set of video signals defines the number of different run-val pairs used to represent that set. For run-val mapping tables of fixed size (e.g., 8-bit tables that support up to 254 run-val codes with two codes being reserved for escape (ESC) and end of block (EOB)), the histogram identifies how many escapes will be required for that set.

Generating Each Run-Val Mapping Table

This section describes how a run-val mapping table is generated from a training set consisting of run-val pairs. The generation of a run-val mapping table is a two-step process: (1) generating a two-dimensional histogram from the run-val pairs and (2) generating a run-val mapping table from the two-dimensional histogram. The first step is functionally equivalent to steps 1004 and 1008 of FIG. 10 and step 1114 of FIG. 11. In a preferred embodiment, the global histogram of step 1108 and the group histograms of step 1114 are generated by summing the corresponding entries of the appropriate individual histograms of step 1004. The second step is functionally equivalent to steps 1006, 1010, and 1018 of FIG. 10 and step 1116 of FIG. 11.

The two-dimensional histogram for a given set of run-val pairs identifies the number of occurrences of each different run-val pair in the set. In general, non-zero quantized transform coefficients (i.e., the vals of the run-val pairs) may be positive or negative. In the histograms, the sign of the val is maintained. That is, for example, there are separate entries for (3,+2) (i.e., a run of three zeros followed by a coefficient of +2) and (3,−2) (i.e., a run of three zeros followed by a coefficient of −2). Note that there are no run-val pairs with val 0, since all zero vals are part of runs.

In a preferred embodiment of the present invention, each run-val mapping table to be generated from a set of run-val pairs has a particular structure. In this preferred embodiment, the structure of a particular run-val mapping table can be designated by a sequence of positive integers. For example, the structure of a run-val mapping table can be designated by the sequence (1, 8, 7, 7, 6, 5, 5, 5, 4, 4, 2, 1, 1), where the first 1 corresponds to two special codes (ESC and EOB, as described below), the 8 implies that the run-val mapping table has run-val codes for a run of 0 from (0,−8) to (0,+8), the first 7 implies that the run-val mapping table has run-val codes for a run of 1 from (1,−7) to (1,+7), etc. Given this sequence, the run-val mapping table can then be unambiguously defined by a sequence of integers corresponding to the run-val codes for the different run-val pairs following a specified convention (e.g., from bottom (i.e., largest negative val) to top (i.e., largest positive val) within each column and from left to right between columns).

Referring now to FIG. 12, there is shown a run-|val| table (a special representation) corresponding to the two-dimensional histogram for all of the run-val pairs of a hypothetical training set. In FIG. 12, the columns correspond to the different runs of transform coefficients in the training set that are quantized to zero. The rows of FIG. 12 correspond to the different absolute values of transform coefficients in the training set that are quantized to non-zero values. The representation is special in that run-val pairs having vals with the same magnitude (i.e., the absolute value of the val is the same) are grouped together. Thus, for example, the run-val pairs (3,+2) and (3,-2) are grouped together as run-|val| pair (3,2) with the entry 18 representing the total number of occurrences of (3,+2) and (3,-2) in the training set. Note that FIG. 12 does not have a row corresponding to the val 0, since all such zeros are part of runs. In FIG. 12, run-|val| pairs without entries do not occur in the training set.

In general, the numbers of occurrences of entries within rows and within columns are monotonically decreasing with increasing length of run and increasing |val|, respectively. This is a typical characteristic of the results of transforming and quantizing normal image data. Note, however, that this is a tendency and not a rule, as evidenced by (0,7) occurring more frequently than (0,6) in FIG. 12. Note, also, that an entry in the interior of the run-|val| table may be 0, as evidenced by (8,3) in FIG. 12. This means that neither a run-val pair of (8,+3) or a run-val pair of (8,-3) occurred in the training set.

Every run-val mapping table preferably has two special codes: an escape code (ESC) and an end-of-block code (EOB). The escape code is used to encode run-val pairs that are not explicitly represented by run-val codes in the run-val mapping table. The end-of-block code is used to signify that the last non-zero quantized transform coefficient in the block has been encoded and the rest of the coefficients in the block are quantized to zero.

To encode all of the run-val pairs in the training set used to generate the run-|val| table of FIG. 12, a structured run-val mapping table would have to have a minimum of 112 different run-val codes. The structure of that run-val mapping table may be represented by the sequence (1, 8, 7, 7, 6, 5, 5, 5, 4, 4, 2, 1, 1) as described above. Two run-val codes are needed for ESC and EOB and 110 run-val codes are needed for 110 different run-val pairs.

According to FIG. 12, the run-|val| pair (2,7) has an entry of 1. That means that either (2,+7) or (2,-7) does not occur in the training set. Nevertheless, due to the structure of the preferred run-val mapping tables, if (2,+7) has a run-val code, then (2,-7) also has a code, and vice versa. Similarly, although neither (8,+3) nor (8,-3) occurs in the training set, nevertheless the preferred run-val mapping table structure implies that both (8,+3) and (8,-3) have run-val codes because (8,4) has a non-zero entry FIG. 12. Thus, the run-|val| table of FIG. 12 implies a run-val mapping table with 112 different run-val codes.

A particular application, however, may impose a limit to the number of run-val codes allowable in any one run-val mapping table. For example, an 8-bit run-val mapping table would be limited to 256 different codes. For purposes of describing the present invention, in the example of FIG. 12, the number of run-val codes allowable in the run-val mapping table is to be limited to 80. Thus, the problem is to decide which subset of the 108 run-val pairs indicated by FIG. 12 are to be represented by the 78 available run-val codes in the run-val mapping table (assuming that 2 codes are reserved for ESC and EOB). Conversely, the problem is to select those run-val pairs to be excluded from the run-val mapping table, which would therefore have to be encoded using escape sequences.

Figure 17:
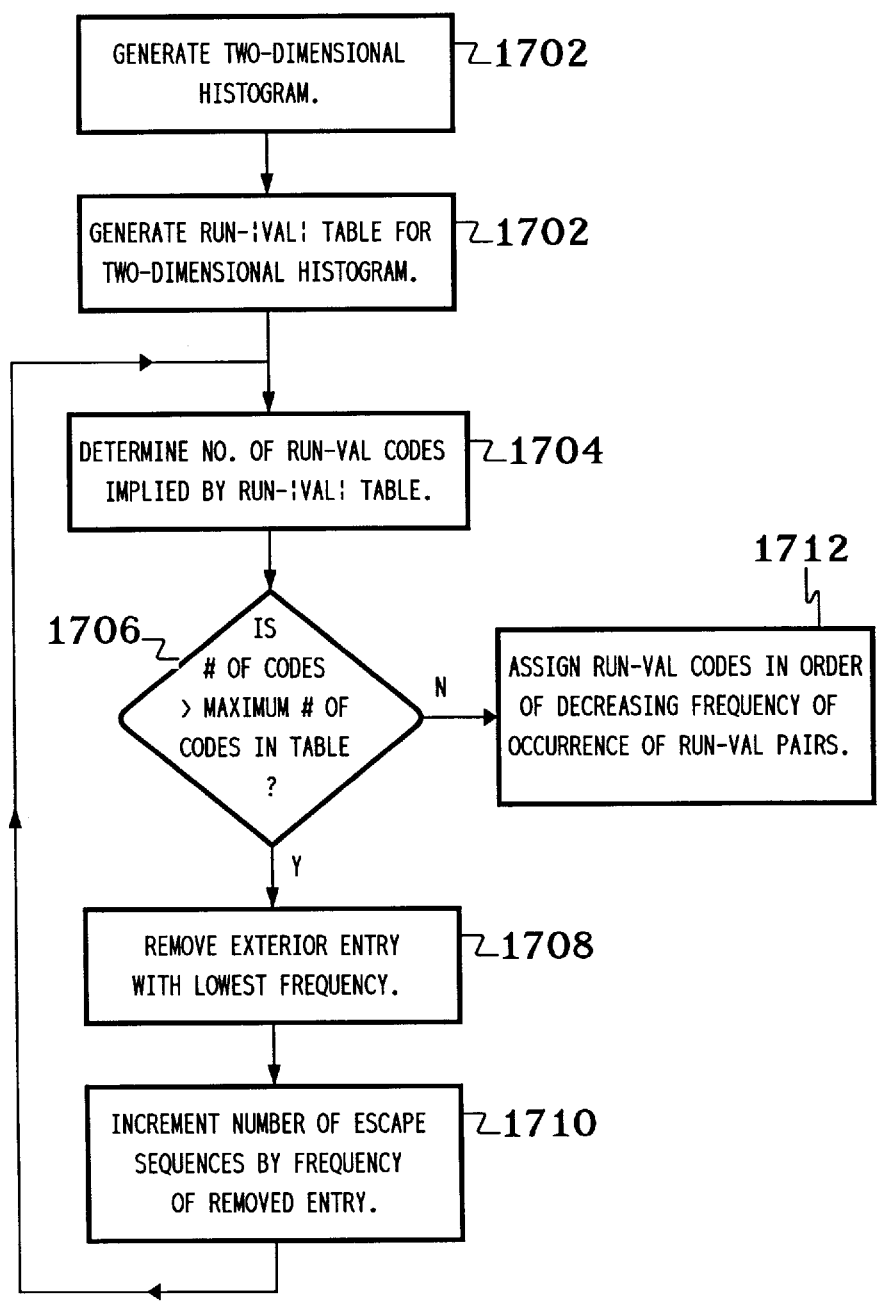
FIG. 17 is a flow diagram of preferred processing for generating a run-val mapping table for a given training set.

Referring now to FIG. 17, there is shown a flow diagram of the processing for generating a run-val mapping table for a given training set, according to a preferred embodiment of the present invention. After generating the two-dimensional histogram for the training set (step 1702 of FIG. 17), the corresponding run-|val| table (see, e.g., FIG. 12) is generated from the histogram (step 1703). The number of run-val codes in a structured run-val mapping table as implied by the full run-|val| table is then determined (step 1704). If the number of run-val codes is greater than the maximum number of codes allowable in the structured run-val mapping table (e.g., 256 for an 8-bit run-val mapping table) (step 1706), then some of the run-val pairs in the training set will not be able to be represented by run-val codes in the mapping table. If a run-val pair is not represented by a run-val code in the mapping table, then it will have to be encoded using the ESC code followed by an escape sequence.

Since escape sequences are disruptive to both the encoding and decoding processing, it is desirable to minimize the number of escape sequences used in encoding a given set of data. Assuming that the training sets are representative of the actual data to be encoded during routine processing, it would appear to be better to assign run-val codes to those run-val pairs that occur most frequently in the training set, and allow those run-val pairs that occur least frequently to be encoded using escape sequences. The structure of the run-val mapping tables, however, adds constraints to the assignment of run-val codes. First of all, if a particular run-val pair (e.g., (2,-7)) is assigned a run-val code, then the corresponding run-val pair having a val with opposite sign (i.e., (2,+7)) is also assigned a run-val code. Secondly, interior entries in the run-|val| table are assigned run-val codes, no matter how infrequently they occur. Thus, if run-val codes are assigned for (0,7) in FIG. 12, the run-val codes are assigned for (0,6) even though (0,6) occurs only twice in the training set.

An interior entry of a run-|val| table is defined as one having at least one non-zero entry above it in the run-|val| table. An exterior entry, on the other hand, has only zero entries above it. In FIG. 12, (8,3) is an interior entry because (8,4) has a non-zero entry above it. (8,4) is an exterior entry.

Referring again to FIG. 17, if the number of run-val codes determined in step 1704 is greater than the maximum number of codes allowable in the structured run-val mapping table (e.g., 256 for an 8-bit run-val mapping table) (step 1706), then the smallest exterior entry in the run-|val| table is removed (step 1708) and a counter for the number of escape sequences is incremented by the frequency of that removed (step 1710). If there are two or more exterior entries with the same smallest value, then one is selected, preferably following some convention (e.g., shortest run first). Processing then returns to step 1704. Every time an entry is removed from the run-|val| table, the number of run-val codes is reduced by two.

The processing of steps 1704–1710 is repeated until the number of run-val codes implied by the adjusted run-|val| table is no longer greater than the maximum number of allowable codes (step 1706). In that case, the adjusted run-|val| table is used to generate the run-val mapping table by assigning run-val codes in order of decreasing frequency of the actual run-val pairs in the training set as determined from the two-dimensional histogram (step 1712). That is, the run-val pair with the largest frequency in the training set is assigned the smallest run-val code (i.e., 0); the run-val pair with the second largest frequency is assigned the second smallest run-val code (i.e., 1); etc. Note that the escape code (ESC) and the end-of-block code (EOB) are assigned run-val codes based on their relative frequencies in the training set as well.

For purposes of explaining the present invention, in the example of FIG. 12, the run-val mapping table is to be limited to 80 different run-val codes. Since the 80-code run-val mapping table can only provide 80 of the 112 different codes implied by the run-|val| table of FIG. 12, 16 entries in the run-|val| table of FIG. 12 (corresponding to 32 run-val pairs) are removed (i.e., ignored) when generating the 80-code run-val mapping table. Each of the removed run-val pairs is to be encoded using an escape sequence (e.g., the special ESC code followed by explicit values corresponding to the run and val of the run-val pair).

To generate the 80-code run-val mapping table, the processing of FIG. 17 may be applied to the run-|val| table of FIG. 12. FIG. 12 represents the run-|val| table that is generated at step 1703 of FIG. 17. As described above, the number of run-val codes implied by the run-|val| table of FIG. 12 if 112 (step 1704), which is greater than 80 (step 1706). There are six exterior entries in the run-|val| table of FIG. 12 with a lowest value of 1 (i.e., (2,7), (3,6), (4,5), (5,5), (6,5), and (8,4)). Note that (8,3) is not an exterior entry. Removing one of them (e.g., (2,7)) (step 1708) adds one escape sequence (i.e., one escape sequence per occurrence) (step 1710) and reduces the number of run-val codes by two (step 1704), leaving 110 run-val codes, which is still greater than 80 (step 1706). Iteratively removing the 5 other exterior entries having a value of 1 reduces the number of run-val codes to 100 with a total of 6 escape sequences.

After removing (8,4) from the run-|val| table of FIG. 12, (8,3) becomes an exterior entry. It also becomes the exterior entry with the lowest value (0). Therefore, in the next pass through steps 1704–1710, (8,3) is removed and the number of run-val codes is reduced to 98, without affecting the total number of escape sequences (since there are no occurrences of either (8,+3) or (8,−3) in the training set).

At that point, there will be three exterior entries in the adjusted run-|val| table with value 2 (i.e., (2,6), (6,4), and (7,4)). Note that (0,6) is still an interior entry. Iteratively removing these three entries reduces the number of run-val codes to 92 and adds 6 more escape codes (2 for each entry) for a cumulative total of 12 escape codes.

At that point, there will be seven exterior entries in the adjusted run-|val| table with value 3 (i.e., (0,8), (1,7), (3,5), (5,4), (8,2), (9,2), and (11,1)). In order to reduce the number of run-val codes from 92 to 80, only 6 of the 7 exterior entries need to be removed (e.g., the first 6), adding another 18 escape codes for a cumulative total of 30 escape codes. Note that (0,6) with a value of only 2 is still an interior entry and is not removed, because exterior entry (0,7) has a value of 4 and will not be removed before the exterior entries having smaller values.

Referring now to FIG. 13, there is shown the adjusted run-|val| table of FIG. 12 with the removed run-|val| entries as indicated as crossed-out with double underlining. The structured run-val mapping table for the remaining run-val pairs is represented as (1, 7, 6, 5, 4, 4, 3, 3, 3, 1, 1, 1, 1). The table would have 2*(1+7+6+5+4+4+3+3+3+1+1+1+1) or 80 codes.

The actual code values in the run-val mapping table generated from the adjusted run-|val| table of FIG. 13 are preferably assigned to the different run-val pairs based on their actual frequencies of occurrence in the training set. In order to provide efficient variable-length coding of the run-val codes using a structured Huffman table, those run-val pairs with a higher frequency of occurrence are preferably assigned smaller run-val codes. Thus, run-val code 0 is reserved for the run-val pair that occurs with the greatest frequency in the training set (e.g., probably either (0,1) or (0,−1)). In the present example, the special ESC code occurs 30 times and the special EOB code will occur as many times as there are blocks of data in the training set. These numbers are taken into account when assigning code values for these special run-val codes.

If, for each run, the frequency of occurrence of absolute vals increases monotonically as the magnitude of the absolute val decreases, then the above-described method will generate an optimal run-val mapping table. An optimal run-val mapping table is one that encodes the current training set with the fewest escape sequences possible. Furthermore, the values of the run-val codes assigned to the run-val pairs represented in the table will provide efficient variable-length coding of the run-val codes.

This same method is used to generate the run-val mapping tables of the present invention, whether they are individual tables based on individual histograms or group tables based on group histograms.

Selection of Run-Val Mapping Tables

The set of run-val mapping tables generated during off-line training processing are programmed into both the encoder and the decoder. During on-line encoding, the encoder selects one of the predefined run-val mapping tables for each set of video signals to be encoded. In a preferred embodiment, a different run-val mapping table may be selected for each different band of each frame of each video sequence to be encoded. The table selection is encoded explicitly into the bitstream as a table identification number within the band header. The decoder recovers the table identification number from the band header to know which predefined run-val mapping table to use to decode the run-val codes in the bitstream for that band.

Figure 14:
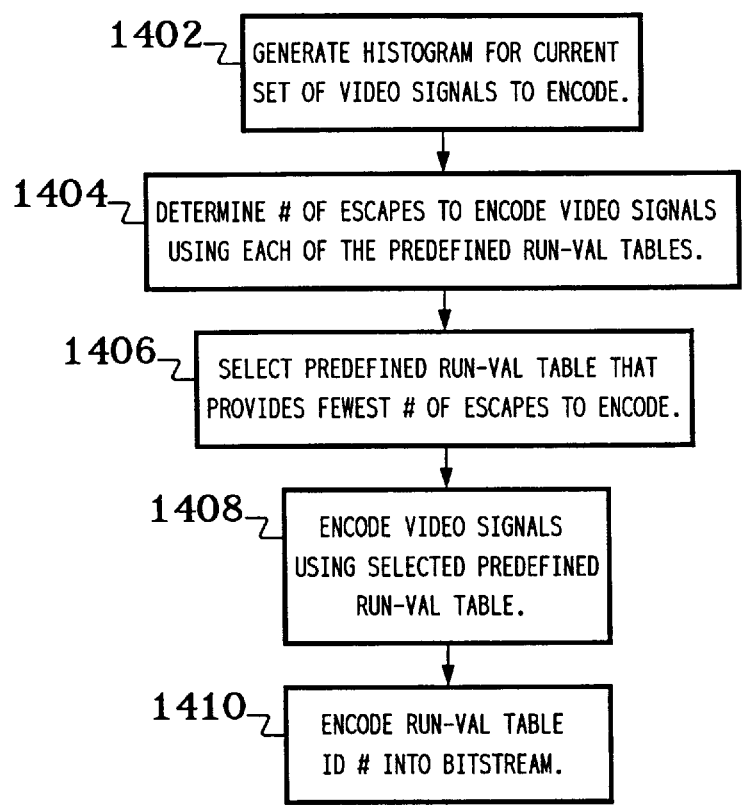
FIG. 14 is a flow diagram of the processing performed to select a run-val mapping table from a set of predefined run-val mapping tables to be used for on-line encoding of video signals, according to a preferred embodiment of the present invention.

Referring now to FIG. 14, there is shown a flow diagram of the processing performed to select a predefined run-val mapping table for on-line encoding of video signals, according to a preferred embodiment of the present invention. The processing of FIG. 14 is a preferred embodiment of processing implemented by run-length encoder 610 of FIG. 6.

In particular, for the current set of video signals to be encoded, a histogram is generated characterizing the frequency of occurrence of the run-val pairs to be encoded (step 1402 of FIG. 14). Using this histogram, the number of escapes that would be used to encode the current set of run-val pairs is determined for each of the predefined run-val mapping tables (step 1404). The predefined run-val mapping table associated with the fewest escapes to encode is selected as the best predefined table for that set of video signals (step 1406). The current set of video signals are encoded using the selected predefined table (step 1408) and the identification number for that table is explicitly encoded into the bitstream (step 1410).

In an alternative embodiment, the selection of which run-val mapping table to use is based on the fewest bits to encode (as determined by Equation (1)) rather than the fewest escapes to encode as in FIG. 14.

Figure 15:
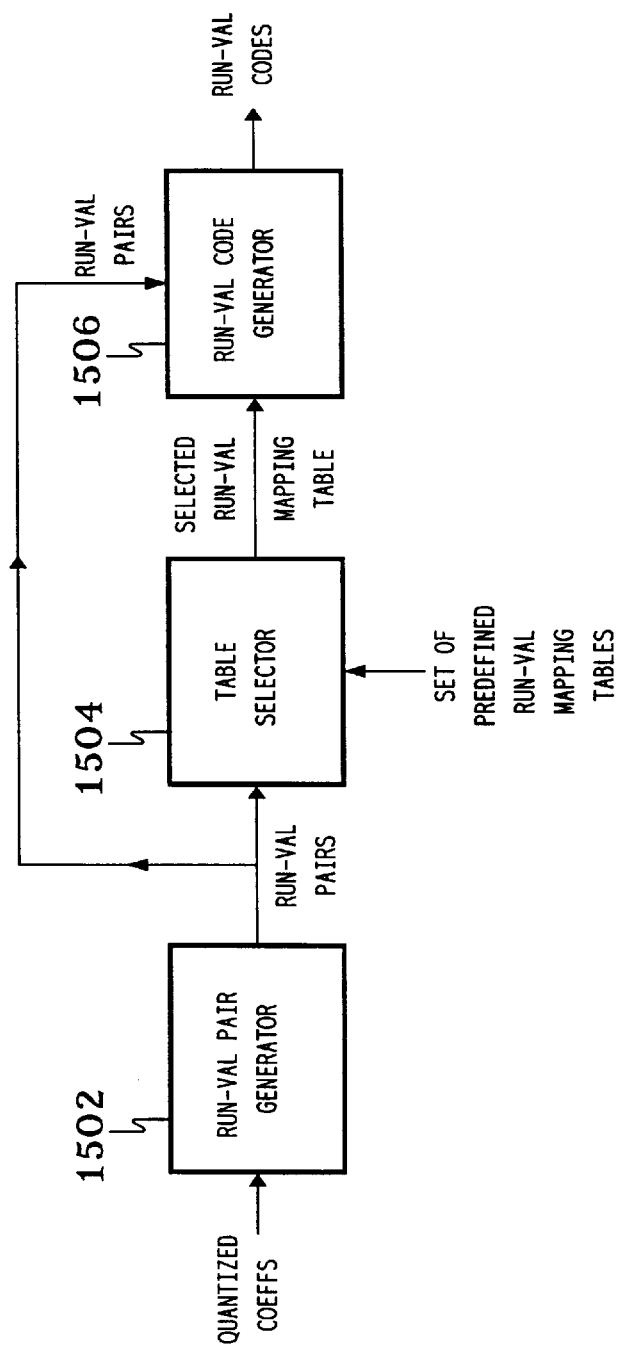
FIG. 15 is a block diagram of the run-length encoder of the band encoder of FIG. 6.

Referring now to FIG. 15, there is shown a block diagram of run-length encoder 610 of band encoder 504 of FIG. 6, according to a preferred embodiment of the present invention. Run-val pair generator 1502 receives quantized transform coefficients from quantizer 608 of FIG. 6 and generates run-val pairs. Table selector 1504 uses those run-val pairs to select one of the predefined run-val mapping tables. Run-val code generator 1506 applies the selected run-val mapping table to the run-val pairs to generate run-val codes for Huffman encoder 612 of FIG. 6.

Figure 16:
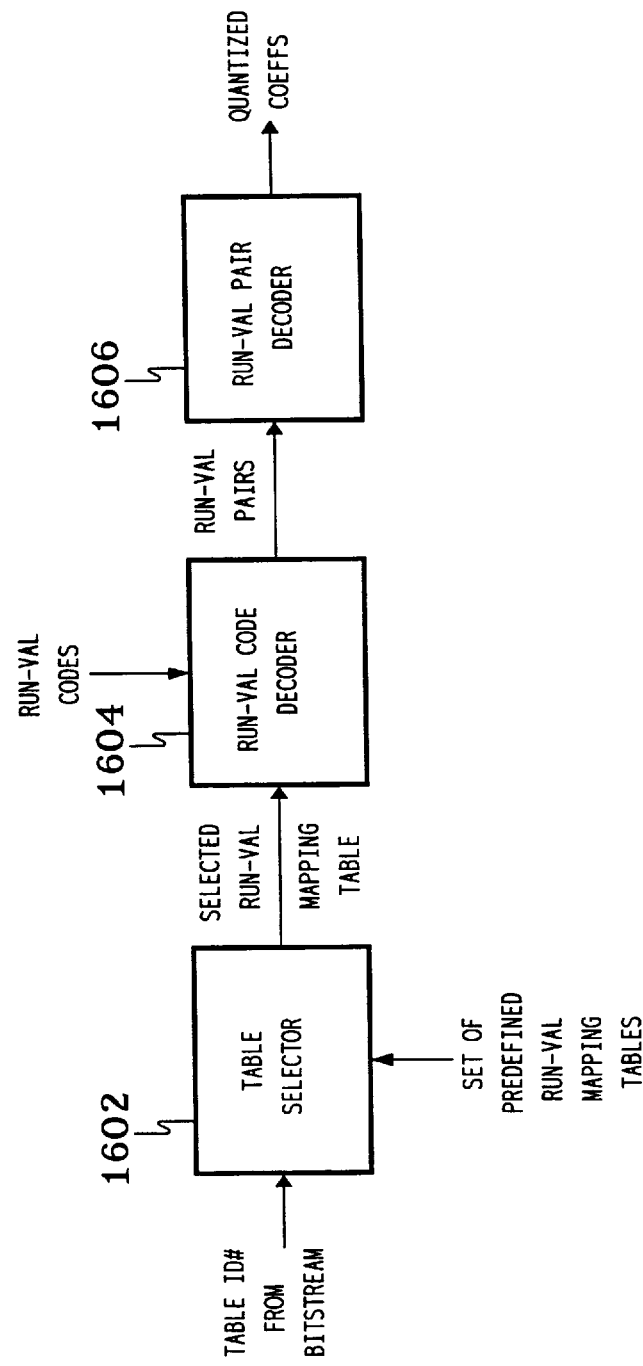
FIG. 16 is a block diagram of the run-length decoder of the band decoder of FIG. 9.

Referring now to FIG. 16, there is shown a block diagram of run-length decoder 904 of band decoder 804 of FIG. 9, according to a preferred embodiment of the present invention. Table selector 1602 uses the table identification number from the encoded bitstream to select one of the predetermined run-val mapping tables. Run-val code decoder 1604 uses the selected run-val mapping table to decode the run-val codes received from Huffman decoder 902 of FIG. 9 to generate run-val pairs. Run-val pair decoder 1606 uses the run-val pairs to (generate quantized transform coefficients for inverse quantizer 906 of Fig, 9.

The present invention can be embodied in the form of methods and apparatuses for practicing those methods. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments combine with the microprocessor to provide a unique device that operates analogous to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for encoding video signals, comprising the steps of:
   (a) providing a plurality of run-val tables; and
   (b) encoding video signals using the plurality of run-val tables, the encoding comprising the steps of:
      (1) generating run-val pairs for a set of video signals;
      (2) selecting from the plurality of run-val tables a first run-val table which maps a first set of run-val pairs to a corresponding first set of run-val codes;
      (3) encoding a first subset of the run-val pairs using the first run-val table to generate a first part of an encoded bitstream;
      (4) selecting from the plurality of run-val tables a second run-val table which maps a second set of run-val pairs to a corresponding second set of run-val codes; and
      (5) encoding a second subset of the run-val pairs using the second run-val table to generate a second part of the encoded bitstream, wherein a run-val table is selected in steps (b)(2) and (b)(4) so that the specified subset of run-val pairs may be encoded using one of fewer escape sequences and fewer bits than any other run-val table of the plurality of run-val tables.

2. The method of claim 1, wherein step (b) further comprises the steps of:
   (6) dividing one or more video frames into a plurality of blocks;
   (7) applying a transform to at least one of the blocks to generate transform coefficients;
   (8) quantizing the transform coefficients to generate quantized transform coefficients, wherein the generating of step (b)(1) generates the run-val pairs from the quantized transform coefficients, the encoding of steps (b)(3) and (b)(5) comprise mapping run-val pairs to run-val codes using the plurality of run-val tables and variable-length encoding the run-val codes to generate variable-length codes, wherein selections of the first and second run-val tables are explicitly identified in the encoded bitstream.

3. The method of claim 1, wherein selections of the run-val tables are explicitly identified in an encoded bitstream for the video signals.

4. A storage medium encoded with machine-readable computer program code for encoding video signals, wherein, when the computer program code is executed by a computer, the computer implements the steps of:
   (a) providing a plurality of run-val tables; and
   (b) encoding video signals using the plurality of run-val tables, said encoding comprising the steps of:
      (1) generating run-val pairs for a set of video signals;
      (2) selecting from the plurality of run-val tables a first run-val table which maps a first set of run-val pairs to a corresponding first set of run-val codes;
      (3) encoding a first subset of the run-val pairs using the first run-val table to generate a first part of an encoded bitstream;
      (4) selecting from the plurality of run-val tables a second run-val table which maps a second set of run-val pairs to a corresponding second set of run-val codes; and
      (5) encoding a second subset of the run-val pairs using the second run-val table to generate a second part of the encoded bitstream, wherein a run-val table is selected in steps (b)(2) and (b)(4) so that the specified subset of run-val pairs may be encoded using one of fewer escape sequences and fewer bits than any other run-val table of the plurality of run-val tables.

5. The storage medium of claim 4, wherein step (b) further comprises the steps of:
   (6) dividing one or more video frames into a plurality of blocks;
   (7) applying a transform to at least two of the blocks to generate transform coefficients;
   (8) quantizing the transform coefficients to generate quantized transform coefficients, wherein the generating of step (b)(1) generates the run-val pairs from the quantized transform coefficients; wherein the encoding of steps (b)(3) and (b)(5) comprise mapping run-val pairs to run-val codes using the plurality of run-val tables and variable-length encoding the run-val codes to generate variable-length codes, wherein selections of the first and second run-val tables are explicitly identified in the encoded bitstream.

6. An apparatus for encoding video signals, comprising:
a run-val generator;
a table selector;
a transformer;
a quantizer; and
a run-val encoder, wherein:
- the run-val generator generates run-vals for video signals;
- the table selector selects from a plurality of run-val tables;
- the run-val encoder uses the selected run-val tables to encode the run-vals;
- the run-val generator is a run-val pair generator;
- the run-val encoder is a run-val code generator;
- the transformer applies a transform to at least two of the blocks to generate transform coefficients;
- the quantizer quantizes the transform coefficients to generate quantized transform coefficients;
- the run-val pair generator generates run-val pairs from the quantized transform coefficients;
- the table selector selects a first run-val table from the plurality of run-val tables;
- the run-val code generator generates run-val codes for run-val pairs corresponding to a first block using the first run-val mapping table;
- the table selector selects a second run-val table from the plurality of run-val tables; and
- the run-val code generator generates run-val codes for run-val pairs corresponding to a second block using the second run-val mapping table.

7. The apparatus of claim 6, further comprising:
a variable-length encoder, wherein:
- the variable-length encoder variable-length encodes the run-val codes for the first and second blocks to generate part of an encoded bitstream for the video signals;
- a selected run-val table encodes a specified subset of video signals using one of fewer escape sequences and fewer bits than any other run-val table of the plurality of run-val tables; and
- selections of the first and second run-val tables are explicitly identified in the encoded bitstream.

8. A method for decoding encoded video signals, comprising the steps of:
(a) providing a plurality of run-val tables; and
(b) decoding encoded video signals using the plurality of run-val tables; wherein step (b) comprises the steps of:
(1) selecting a first run-val table from the plurality of run-val tables;
(2) decoding a first subset of the encoded video signals using the first run-val mapping table to generate a first set of run-val pairs;
(3) selecting a second run-val table from the plurality of run-val tables; and
(4) decoding a second subset of the encoded video signals using the second run-val mapping table to generate a second set of run-val pairs.

9. The method of claim 8, wherein step (b) further comprises the steps of:
(5) variable-length decoding the encoded video signals to generate run-val codes;
(6) mapping the run-val codes to run-vals using the plurality of run-val tables;
(7) generating quantized transform coefficients from the run-vals;
(8) dequantizing the quantized transform coefficients to generate at least one block of dequantized transform coefficients; and
(9) applying an inverse transform to at least one of the blocks to generate component signals for one or more video frames.

10. The method of claim 8, wherein a selected run-val table decodes a specified subset of encoded video signals to generate a set of decoded video signals, wherein the selected run-val table is capable of encoding the set of decoded video signals using one of fewer escape sequences and fewer bits than any other run-val table of the plurality of run-val tables.

11. The method of claim 8, wherein step (b) further comprises the steps of:
(5) variable-length decoding the encoded video signals to generate run-val codes;
(6) generating quantized transform coefficients from the first and second sets of run-val pairs;
(7) dequantizing the quantized transform coefficients to generate at least two blocks of dequantized transform coefficients; and
(8) applying an inverse transform to at least two of the blocks to generate component signals for one or more video frames, wherein:
- a selected run-val table decodes a specified subset of encoded video signals to generate a set of decoded video signals, wherein the selected run-val table is capable of encoding the set of decoded video signals using one of fewer escape sequences and fewer bits than any other run-val table of the plurality of run-val tables; and
- selections of the run-val tables are explicitly identified in an encoded bitstream for the encoded video signals.

12. A storage medium encoded with machine-readable computer program code for encoding video signals, wherein, when the computer program code is executed by a computer, the computer implements the steps of:
(a) providing a plurality of run-val tables; and
(b) decoding encoded video signals using the plurality of run-val tables, wherein step (b) comprises the steps of:
(1) variable-length decoding the encoded video signals to generate run-val codes;
(2) selecting a first run-val table from the plurality of run-val tables;
(3) decoding a first subset of the run-val codes using the first run-val mapping table to generate a first set of run-val pairs;
(4) selecting a second run-val table from the plurality of run-val tables; and
(5) decoding a second subset of the run-val codes using the second run-val mapping table to generate a second set of run-val pairs.

13. The storage medium of claim 12, wherein step (b) further comprises the steps of:
(6) generating quantized transform coefficients from the first and second sets of run-val pairs;
(7) dequantizing the quantized transform coefficients to generate at least two blocks of dequantized transform coefficients; and
(8) applying an inverse transform to at least two of the blocks to generate component signals for one or more video frames, wherein:

a selected run-val table decodes a specified subset of encoded video signals to generate a set of decoded video signals, wherein the selected run-val table is capable of encoding the set of decoded video signals using one of fewer escape sequences and fewer bits than any other run-val table of the plurality of run-val tables; and selections of the run-val tables are explicitly identified in an encoded bitstream for the encoded video signals.

14. An apparatus for decoding encoded video signals, comprising:

a table selector;

a run-val decoder;

an inverse quantizer; and an inverse transformer; wherein:

the table selector selects from a plurality of run-val tables;

the run-val decoder uses the selected run-val tables to decode the encoded video signals;

the run-val decoder comprises a run-val code decoder and a run-val pair decoder;

the table selector selects a first run-val table from the plurality of run-val tables;

the run-val code decoder decodes a first subset of the run-val codes using the first run-val mapping table to generate a first set of run-val pairs;

the table selector selects a second run-val table from the plurality of run-val tables;

the run-val code decoder decodes a second subset of the run-val codes using the second run-val mapping table to generate a second set of run-val pairs;

the run-val pair decoder generates quantized transform coefficients from the first and second sets of run-val pairs;

the inverse quantizer dequantizes the quantized transform coefficients to generate at least two blocks of dequantized transform coefficients; and the inverse transformer applies an inverse transform to at least two of the blocks to generate component signals for one or more video frames.

15. The apparatus of claim 14, further comprising:

a variable-length decoder, wherein the variable-length decoder variable-length decodes the encoded video signals to generate run-val codes, wherein:

a selected run-val table decodes a specified subset of encoded video signals to generate a set of decoded video signals, wherein the selected run-val table is capable of encoding the set of decoded video signals using one of fewer escape sequences and fewer bits than any other run-val table of the plurality of run-val tables; and selections of the run-val tables are explicitly identified in an encoded bitstream for the encoded video signals.

* * * * *